(12) United States Patent
Park

(10) Patent No.: US 11,032,901 B2
(45) Date of Patent: Jun. 8, 2021

(54) PRINTED CIRCUIT BOARD AND ELECTRONIC DEVICE HAVING THE SAME

(71) Applicant: Samsung Electro-Mechanics Co., Ltd., Suwon-si (KR)

(72) Inventor: Jung-Hwan Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/662,163

(22) Filed: Oct. 24, 2019

(65) Prior Publication Data

US 2020/0163203 A1 May 21, 2020

(30) Foreign Application Priority Data

Nov. 16, 2018 (KR) ........................ 10-2018-0141583

(51) Int. Cl.
| | |
|---|---|
| H05K 1/00 | (2006.01) |
| H05K 1/02 | (2006.01) |
| H05K 1/14 | (2006.01) |
| H05K 3/00 | (2006.01) |
| G02B 6/12 | (2006.01) |
| G02B 6/43 | (2006.01) |
| G02B 6/138 | (2006.01) |
| H04R 25/00 | (2006.01) |
| H05K 1/18 | (2006.01) |
| H05K 3/32 | (2006.01) |
| H05K 3/46 | (2006.01) |
| H01Q 1/38 | (2006.01) |
| H01Q 1/24 | (2006.01) |

(52) U.S. Cl.
CPC .............. *H05K 1/0237* (2013.01); *H01Q 1/38* (2013.01); *H05K 1/0277* (2013.01); *H05K 1/148* (2013.01); *H05K 1/185* (2013.01); *H05K 1/189* (2013.01); *H05K 3/32* (2013.01); *H05K 3/4691* (2013.01); *H01Q 1/243* (2013.01); *H05K 2201/10098* (2013.01)

(58) Field of Classification Search
CPC .......... H05K 1/00; H05K 1/02; H05K 1/0247; H05K 1/14; H05K 1/182; H05K 1/188; H05K 3/00; G02B 6/12; G02B 6/43; G02B 6/138; H04R 25/00; H04R 25/60; H04R 25/225; H04R 25/505; H04R 25/554; H04R 25/556; H04R 25/558
USPC ........ 361/749, 766; 174/250, 252, 254, 255, 174/258, 259, 262; 348/308, 373, 374; 385/14, 129, 831, 846, 852
See application file for complete search history.

(56) References Cited

U.S. PATENT DOCUMENTS

| | | | | |
|---|---|---|---|---|
| 5,206,463 | A * | 4/1993 | DeMaso | H05K 3/4691 174/254 |
| 9,860,978 | B1 * | 1/2018 | Liu | H05K 1/115 |
| 2003/0219956 | A1 * | 11/2003 | Mori | H05K 1/185 438/393 |
| 2006/0042826 | A1 * | 3/2006 | Kondo | H05K 3/4617 174/255 |
| 2006/0169485 | A1 * | 8/2006 | Kawaguchi | H05K 3/4691 174/254 |

(Continued)

*Primary Examiner* — Xiaoliang Chen
(74) *Attorney, Agent, or Firm* — NSIP Law

(57) ABSTRACT

Provided is a printed circuit board including: a first flexible insulating layer; a first rigid insulating layer stacked on a first portion of the first flexible insulating layer; and an electronic element embedded in the first flexible insulating layer in stacked formation with the rigid insulating layer.

10 Claims, 10 Drawing Sheets

(56) References Cited

U.S. PATENT DOCUMENTS

| | | | | |
|---|---|---|---|---|
| 2009/0028497 A1* | 1/2009 | Kodama | ............. | H05K 1/0274 |
| | | | | 385/14 |
| 2009/0084583 A1* | 4/2009 | Ueno | ................. | H05K 3/4691 |
| | | | | 174/254 |
| 2010/0065313 A1* | 3/2010 | Takeuchi | ............ | H05K 1/0278 |
| | | | | 174/258 |
| 2010/0170703 A1* | 7/2010 | Iihola | ................... | H05K 3/4691 |
| | | | | 174/254 |
| 2010/0195967 A1* | 8/2010 | Wang | ....................... | G02B 6/43 |
| | | | | 385/129 |
| 2011/0094776 A1* | 4/2011 | Lee | ..................... | H05K 1/0278 |
| | | | | 174/254 |
| 2011/0198111 A1* | 8/2011 | Naganuma | .......... | H05K 3/4691 |
| | | | | 174/254 |
| 2011/0285890 A1* | 11/2011 | Choi | ................... | H04N 5/2253 |
| | | | | 348/308 |
| 2014/0162406 A1* | 6/2014 | Cho | ................... | H01L 21/6835 |
| | | | | 438/110 |
| 2014/0375876 A1* | 12/2014 | Ikemoto | ................ | H05K 1/182 |
| | | | | 348/373 |
| 2015/0053463 A1* | 2/2015 | Chen | ................... | H05K 3/4694 |
| | | | | 174/254 |
| 2016/0095207 A1* | 3/2016 | Taniguchi | ........... | H05K 3/4691 |
| | | | | 174/252 |
| 2016/0183363 A1* | 6/2016 | Lee | ..................... | B23K 26/362 |
| | | | | 174/254 |
| 2017/0196094 A1* | 7/2017 | Mayr | ...................... | H05K 3/32 |
| 2019/0103360 A1* | 4/2019 | Yu | ...................... | H01L 23/5387 |

* cited by examiner

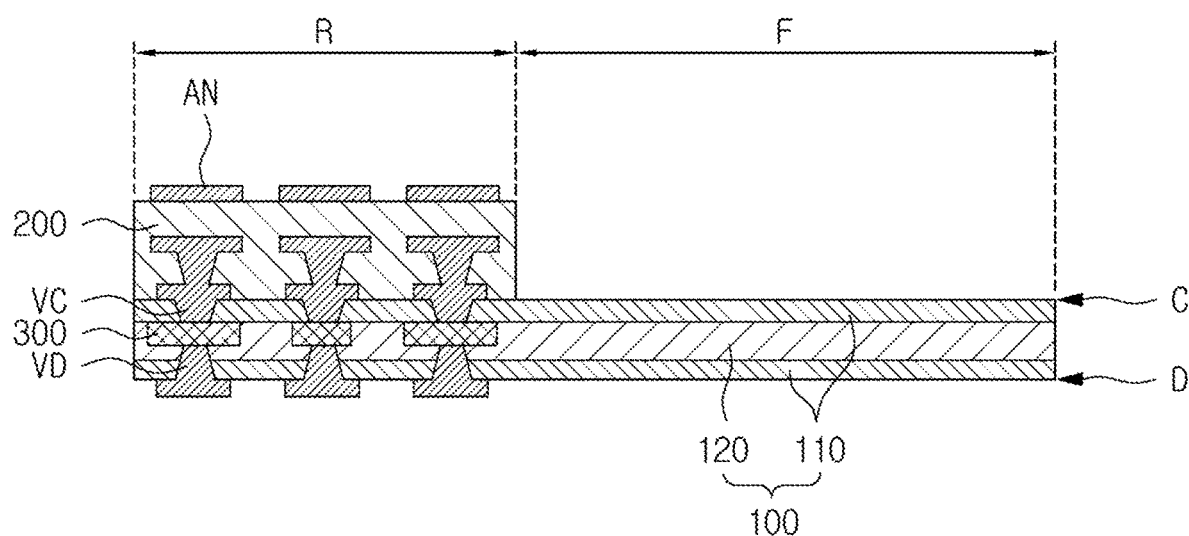

PRINTED CIRCUIT BOARD AND ELECTRONIC DEVICE HAVING THE SAME

CROSS-REFERENCE TO RELATED APPLICATION

This application claims the benefit under 35 USC § 119(a) of Korean Patent Application No. 10-2018-0141583, filed on Nov. 16, 2018 in the Korean Intellectual Property Office, the entire disclosure of which is incorporated herein by reference for all purposes.

BACKGROUND

1. Field

The following description relates to a printed circuit board and an electronic device having the same.

2. Description of Related Art

Technological development related to the commercialization of fifth generation (5G) wireless network technology has increased. However, it may be difficult to smoothly or seamlessly transmit signals in a frequency band of 10 GHz or more with 5G technology, if the transmission is being attempted with existing materials and structures. Accordingly, new materials and structures for transmitting received high-frequency signals to a main board without signal loss are being developed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes a first flexible insulating layer, a first rigid insulating layer stacked on a first portion of the first flexible insulating layer; and an electronic element embedded in the first flexible insulating layer in stacked formation with the rigid insulating layer.

The printed circuit board may include an antenna that is formed on the first rigid insulating layer.

The first flexible insulating layer may include a thermoplastic resin layer and a thermosetting resin layer, and the electronic element is embedded in the thermoplastic resin layer.

The thermosetting resin layer may be stacked on at least one surface of the thermoplastic resin layer.

The thermoplastic resin layer and the thermosetting resin layer may each be formed in a plurality of layers, the first flexible insulating layer may be formed by alternately stacking the plurality of thermoplastic resin layers and the plurality of thermosetting resin layers, and the electronic element may be embedded in at least one of the plurality of thermoplastic resin layers.

The first rigid insulating layer may be stacked on at least one surface of the first portion of the first flexible insulating layer.

The printed circuit board may further include a second flexible insulating layer stacked on the first rigid insulating layer, wherein the electronic element may be embedded in at least one of the first flexible insulating layer and the second flexible insulating layer.

The printed circuit board may further include a second rigid insulating layer stacked on a second portion of the first flexible insulating layer, and the first rigid insulating layer and the second rigid insulating layer may be spaced apart from each other.

The electronic element may be configured to be mounted in stacked formation with at least one of the first rigid insulating layer and the second rigid insulating layer.

The second rigid insulating layer may be stacked on at least one surface of the second portion of the first flexible insulating layer.

The printed circuit board may further include a connection pad formed at an end of the first flexible insulating layer.

In a general aspect, an electronic device includes a main board to which a printed circuit board is coupled, wherein the printed circuit board comprises a first flexible insulating layer configured to be connected to the main board, a first rigid insulating layer stacked on a first portion of the flexible insulating layer; and an electronic element embedded in the first flexible insulating layer in stacked formation with the rigid insulating layer.

The printed circuit board may further include an antenna that is formed on the first rigid insulating layer.

The first flexible insulating layer may include a thermoplastic resin layer and a thermosetting resin layer, and the electronic element may be embedded in the thermoplastic resin layer.

The thermosetting resin layer may be stacked on at least one surface of the thermoplastic resin layer.

The thermoplastic resin layer and the thermosetting resin layer may be each formed in a plurality of layers, the first flexible insulating layer may be formed by alternately stacking the plurality of thermoplastic resin layers and the plurality of thermosetting resin layers, and the electronic element may be embedded in at least one of the plurality of thermoplastic resin layers.

The first rigid insulating layer may be stacked on at least one surface of the first portion of the first flexible insulating layer.

The printed circuit board may further include a second flexible insulating layer stacked on the first rigid insulating layer, and the electronic element may be embedded in at least one of the first flexible insulating layer and the second flexible insulating layer.

The printed circuit board may further include a second rigid insulating layer stacked on a second portion of the first flexible insulating layer, and the first rigid insulating layer and the second rigid insulating layer may be spaced apart from each other.

The electronic element may be configured to be mounted in stacked formation with at least one of the first rigid insulating layer and the second rigid insulating layer.

The second rigid insulating layer may be stacked on at least one surface of the second portion of the first flexible insulating layer.

The printed circuit board may further include a connection pad formed at an end of the first flexible insulating layer and bonded to a connection terminal of the main board.

The printed circuit board may be formed in a plurality of printed circuit boards.

Other features and aspects will be apparent from the following detailed description, the drawings, and the claims.

BRIEF DESCRIPTION OF THE DRAWINGS

FIG. 2 is a diagram illustrating an example of a printed circuit board in accordance with one or more embodiments;

Figure 1A:
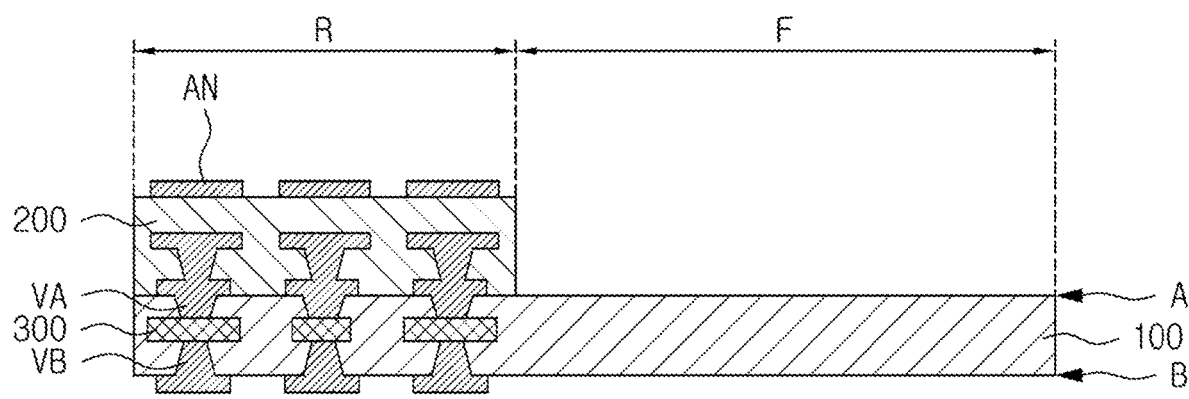
FIGS. 1A-1B are diagrams illustrating an example of a printed circuit board in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Printed Circuit Board (PCB)

First Example

Figure 1B:
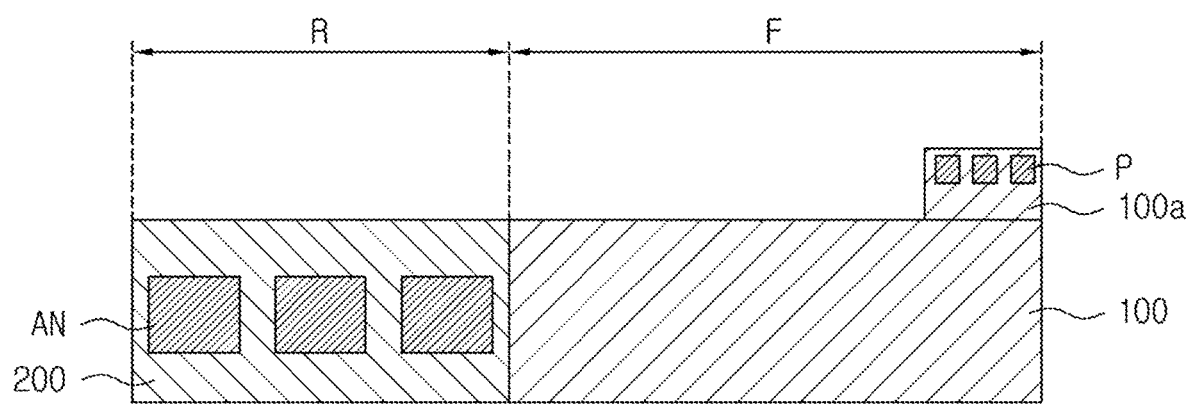

FIGS. 1A-1B are diagrams illustrating an example of a PCB according to an example. FIG. 1A illustrates an internal structure of the PCB, and FIG. 1B illustrates a structure of an upper surface of the PCB.

The PCB according to an example, may have a rigid region R and a flexible region F. The rigid region R is a portion with a relatively low bendability, and the flexible region F is a portion with a relatively high bendability and may be bent at a predetermined angle if necessary. The PCB may be a rigid-flexible integrated board with the flexible region F extending from the rigid region R, and may be distinguished from a PCB with a rigid board and a flexible board separately manufactured and then combined with each other through soldering or the like. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

Referring to FIGS. 1A and 1B, the PCB according to an example may include a flexible insulating layer 100, a rigid insulating layer 200, and an electronic element 300.

The flexible insulating layer 100 may be formed of a flexible and bendable insulating material. In detail, polyimide (PI), modified polyimide, a modified epoxy resin, a liquid crystal polymer (LCP), polytetrafluoroethylene (PTFE), polyphenylene sulfide (PPS), polyphenylene ether (PPE), and similar materials may be used as the insulating material of the flexible insulating layer 100. However, the insulating material is not limited thereto. The flexible insulating layer 100 may have a dielectric dissipation factor (Df) of 0.005 or less, preferably 0.002 or less, and a dielectric constant (Dk) of 3.5 or less, preferably 3.0 or less.

A connection circuit may be formed on the flexible insulating layer 100. The connection circuit may be located on an outer surface A or B of the flexible insulating layer 100, and may extend in the lengthwise direction of the flexible insulating layer 100 to electrically connect the rigid region R to an external source (e.g., a main board, etc.). When the connection circuit is formed on the outer surface of the flexible insulating layer 100, a flexible coverlay for protecting the connection circuit may be stacked on the outer side of the flexible insulating layer 100.

A connection pad P may be formed at one end of the flexible insulating layer 100. The connection circuit may be connected to the connection pad P. In detail, a bent portion 100a, bent at an angle of 90 degrees with respect to the extending direction of the flexible insulating layer 100, may be formed at one end of the flexible insulating layer 100, and the connection pad P may be formed in the bent portion 100a. If necessary, when the flexible region F is bent, the bent portion 100a may be bent.

The rigid insulating layer 200 may be formed of an insulating material with a relatively low bendability. In detail, in an example, an epoxy resin may be used as the insulating material of the rigid insulating layer 200. In particular, a fiber reinforcing material such as glass fiber may be contained in the rigid insulating layer 200, and the rigid insulating layer 200 may be a prepreg. However, the material contained in the rigid insulating layer 200 is not limited to glass. Additionally, inorganic fillers may be contained in the rigid insulating layer 200.

The rigid insulating layer 200 may be stacked on a portion of the flexible insulating layer 100. The rigid insulating layer 200 may be stacked on one surface of the portion of the flexible insulating layer 100 to implement an asymmetric PCB. The region where the rigid insulating layer 200 is stacked is the rigid region R. The rigid insulating layer 200 may not be included in the flexible region F, and may only be included in the rigid region R. On the other hand, the flexible insulating layer 100 may be included in both the rigid region R and the flexible region F.

For example, the rigid region R of the PCB may be composed of the flexible insulating layer 100 and the rigid insulating layer 200, and the flexible region F may be composed of only the flexible insulating layer 100.

An antenna AN may be provided on the rigid insulating layer 200 of the rigid region R. The antenna AN may include various types of antennas such as a patch type, a dipole type, and the like. For example, the antenna AN may be a patch type and, as shown in FIG. 1B, a plurality of patch antennas may be attached to the rigid insulating layer 200 to form an antenna array. On the other hand, a ground layer may be formed around the antenna array of the rigid insulating layer 200, but is not shown in FIG. 1.

A circuit electrically connected to the antenna AN may be formed on the rigid insulating layer 200 of the rigid region R. The circuit of the rigid insulating layer 200 may be connected to the connection circuit of the flexible insulating layer 100.

In an example, the rigid insulating layer 200 may be composed of a plurality of layers, and the antenna AN may be formed on the outermost layer of the rigid insulating layers 200. An auxiliary antenna may be formed on an inner layer of the rigid insulating layers 200, and the antenna AN formed on the outermost layer and the auxiliary antenna formed on the inner layer may face each other without physical connection, or may be directly connected through a via.

The electronic element 300 may be embedded in the flexible insulating layer 100 of the rigid region R in stacked formation with the rigid insulating layer 200. That is, the electronic element 300 may be embedded in the flexible insulating layer 100 of the rigid region R.

The electronic element 300 may include an active element, a passive element, etc., and specifically, may be a radio frequency integrated circuit (RFIC), a capacitor, or the like. In particular, the RFIC may be electrically connected to the antenna AN to process a signal received from the antenna AN and transmit the processed signal to the connection circuit. Also, the RFIC may process a signal received from the connection circuit and transmit the processed signal to the antenna AN.

In this example, a signal transmission distance may be shortened compared to an example where the electronic element 300 is located on an outermost layer of the rigid region R, and thus signal loss may be reduced.

The electronic element 300 may be connected to the circuit of the rigid insulating layer 200 through a via, and may be connected to the connection circuit of the flexible insulating layer 100 through a via. For example, the connection circuit may be formed on the surface B of the flexible insulating layer 100, the antenna AN may be electrically connected to the electronic element 300 through a circuit and a via VA, and the electronic element 300 may be connected to the connection circuit through a via VB. When the connection circuit is formed on the surface A of the flexible insulating layer 100, the electronic element 300 may be connected to the connection circuit not through the via VB but through another via passing from the surface A of the flexible insulating layer 100 to the electronic element 300.

Second Example

FIG. 2 is a diagram illustrating an example of a PCB according to an example.

The PCB according to an example may have a rigid region R and a flexible region F.

Referring to FIG. 2, the PCB according to an example may include a flexible insulating layer 100, a rigid insulating layer 200, and an electronic element 300.

The flexible insulating layer 100 may include a thermosetting resin layer 110 and a thermoplastic resin layer 120.

The flexible insulating layer 100 may be formed of a flexible and bendable insulating material. The insulating material of the thermosetting resin layer 110 may include at least one of PI, an LCP, PTFE, and PPS. Additionally, the insulating material of the thermoplastic resin layer 120 has adhesiveness and may include at least one of modified polyimide, a modified epoxy resin, and PPE.

At least one of the thermosetting resin layer 110 and the thermoplastic resin layer 120 of the flexible insulating layer 100 may have a Df of 0.005 or less, preferably, 0.002 or less and a Dk of 3.5 or less, preferably, 3.0 or less.

The thermosetting resin layer 110 may be stacked on both surfaces of the thermoplastic resin layer 120. There is no particular limitation on the thickness of the thermosetting resin layer 110 and the thickness of the thermoplastic resin layer 120, and the thickness of one thermosetting resin layer 110 may be smaller than the thickness of the thermoplastic resin layer 120. In FIG. 2, the thickness of one thermosetting resin layer 110 is shown to be smaller than the thickness of the thermoplastic resin layer 120. However, unlike FIG. 2, the thickness of one thermosetting resin layer 110 and the thickness of the thermoplastic resin layer 120 may be the same.

A connection circuit may be formed on the flexible insulating layer 100. The connection circuit is may be located on an outer surface C or D of the flexible insulating layer 100 and may extend in the lengthwise direction of the flexible insulating layer 100 to electrically connect the rigid region R to an external source (e.g., a main board, etc.). When the connection circuit is formed on the outer surface of the flexible insulating layer 100, a flexible coverlay for protecting the connection circuit may be stacked on the outer side of the flexible insulating layer 100.

A connection pad P (not shown) may be formed at one end of the flexible insulating layer 100. The connection circuit may be connected to the connection pad P.

The rigid insulating layer 200 may be formed of an insulating material with a relatively low bendability. In detail, an epoxy resin may be used as the insulating material of the rigid insulating layer 200. In particular, a fiber reinforcing material such as glass fiber may be contained in the rigid insulating layer 200, and the rigid insulating layer 200 may be a prepreg. However, the material of the rigid insulating layer 200 is not limited thereto. In an example, inorganic fillers may be contained in the rigid insulating layer 200.

The rigid insulating layer 200 may be stacked on a portion of the flexible insulating layer 100. The rigid insulating layer 200 may be stacked on one surface of the portion of the flexible insulating layer 100 to implement an asymmetric PCB. A region where the rigid insulating layer 200 is stacked is the rigid region R. The rigid insulating layer 200 may not be included in the flexible region F, and may only be included in the rigid region R. On the other hand, the flexible insulating layer 100 is may be included in both the rigid region R and the flexible region F.

For example, the rigid region R of the PCB may be composed of the flexible insulating layer 100 and the rigid insulating layer 200, and the flexible region F may be composed of only the flexible insulating layer 100.

An antenna AN may be provided on the rigid insulating layer 200 of the rigid region R. The antenna AN may include various types of antennas such as a patch type, a dipole type, and the like. A plurality of patch antennas may be attached to the rigid insulating layer 200 to form an antenna array. Meanwhile, a ground layer may be formed around the antenna array of the rigid insulating layer 200.

A circuit electrically connected to the antenna AN may be formed on the rigid insulating layer 200 of the rigid region R. The circuit of the rigid insulating layer 200 may be connected to the connection circuit of the flexible insulating layer 100.

The rigid insulating layer 200 may be composed of a plurality of layers, and the antenna AN may be formed on the outermost layer of the rigid insulating layers 200. An auxiliary antenna may be formed on an inner layer of the rigid insulating layers 200, and the antenna AN formed on the outermost layer and the auxiliary antenna formed on the inner layer may face each other without physical connection, or may be directly connected through a via.

The electronic element 300 may be embedded in the flexible insulating layer 100 of the rigid region R to correspond to the rigid insulating layer 200. That is, the electronic element 300 may be embedded in the flexible insulating layer 100 of the rigid region R. In particular, the electronic element 300 may be embedded in the thermoplastic resin layer 120, and one surface of the electronic element 300 may be located at an interface between the thermoplastic resin layer 120 and the thermosetting resin layer 110. In this example, the electronic element 300 may be embedded in the thermoplastic resin layer 120 to be biased upward or downward from the center.

The electronic element 300 may include an active element, a passive element, etc., and specifically, may be an RFIC, a capacitor, or the like. In particular, the RFIC may be electrically connected to the antenna AN to process a radio frequency (RF) signal.

In this example, a signal transmission distance may be shortened compared to an example where the electronic element 300 is located on an outermost layer of the rigid region R, and thus signal loss may be reduced.

The electronic element 300 may be connected to the circuit of the rigid insulating layer 200 through a via and may be connected to the connection circuit of the flexible insulating layer 100 through a via. For example, the connection circuit may be formed on the surface D of the flexible insulating layer 100, the antenna AN may be electrically connected to the electronic element 300 through a circuit and a via VC, and the electronic element 300 may be connected to the connection circuit through a via VD. Here, the electronic element 300 may be embedded in the thermoplastic resin layer 120 to be biased toward the via VC, and thus the via VD may be longer than the via VC.

On the other hand, when the connection circuit is formed on the surface C of the flexible insulating layer 100, the electronic element 300 may be connected to the connection circuit not through the via VD, but through another via passing from the surface C of the flexible insulating layer 100 to the electronic element 300 through the thermosetting resin layer 110.

Third Example

Figure 3A:
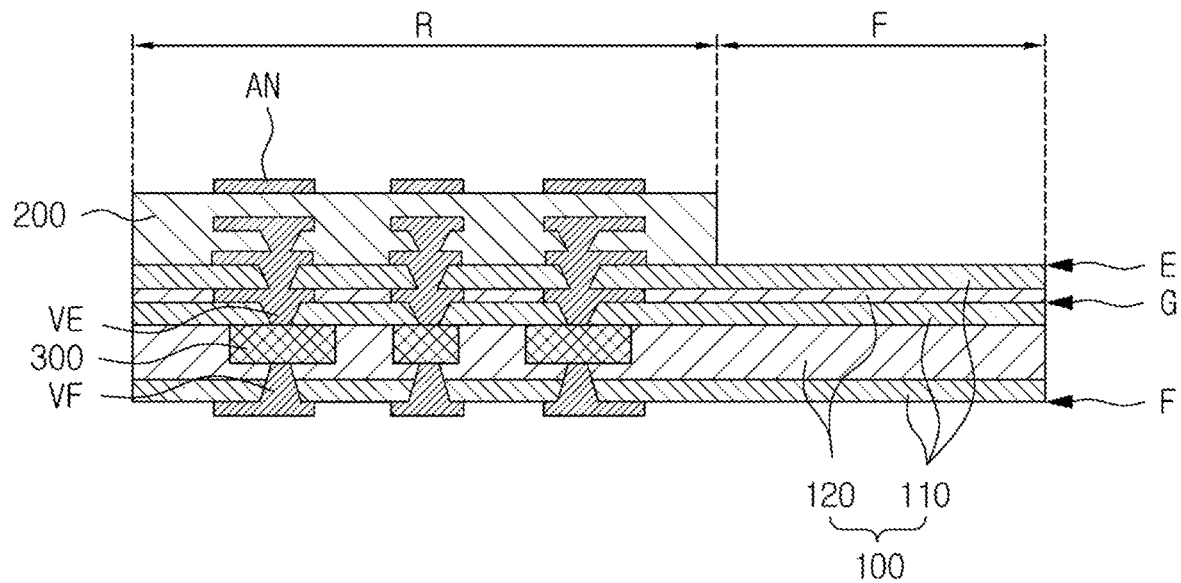
FIGS. 3A-3B are diagrams illustrating an example of a printed circuit board in accordance with one or more embodiments.
Figure 3B:
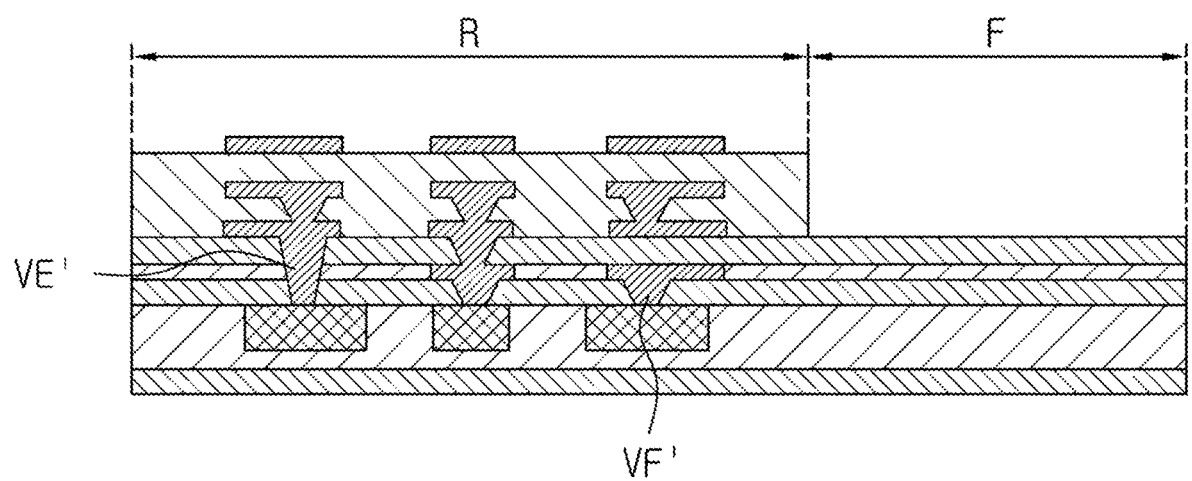

FIGS. 3A-3B illustrate an example of a PCB.

The PCB according to the third example may have a rigid region R and a flexible region F.

Referring to FIGS. 3A and 3B, the PCB may include a flexible insulating layer 100, a rigid insulating layer 200, and an electronic element 300.

The flexible insulating layer 100 may include a plurality of thermosetting resin layers 110 and a plurality of thermoplastic resin layers 120, and may be formed by alternately stacking the plurality of thermosetting resin layers 110 and the plurality of thermoplastic resin layers 120. As shown in FIGS. 3A and 3B, three thermosetting resin layers 110 and two thermoplastic resin layers 120 may be alternately stacked such that the thermosetting resin layers 110 may be located on both outermost sides. Additionally, the plurality of thermosetting resin layers 110 may have different thicknesses. The plurality of thermoplastic resin layers 120 may have different thicknesses. The thermosetting resin layer 110 and the thermoplastic resin layer 120 may also have different thicknesses.

The flexible insulating layer 100 may be formed of a flexible and bendable insulating material. The insulating material of the thermosetting resin layers 110 may include at least one of PI, an LCP, PTFE, and PPS. Additionally, the insulating material of the thermoplastic resin layers 120 has adhesiveness and may include at least one of modified polyimide, a modified epoxy resin, and PPE.

At least one of the thermosetting resin layer 110 and the thermoplastic resin layer 120 of the flexible insulating layer 100 may have a Df of 0.005 or less, preferably, 0.002 or less and a Dk of 3.5 or less, preferably, 3.0 or less.

A connection circuit may be formed on the flexible insulating layer 100. The connection circuit may be located on an outer surface E or F or an inner surface G of the flexible insulating layer 100, and may extend in the lengthwise direction of the flexible insulating layer 100 to electrically connect the rigid region R to an external source (e.g., a main board, etc.). When the connection circuit is formed on the outer surface E or F of the flexible insulating layer 100, a flexible coverlay for protecting the connection circuit may be stacked on the outer side of the flexible insulating layer 100.

A connection pad P may be formed at one end of the flexible insulating layer 100. The connection circuit may be connected to the connection pad P.

The rigid insulating layer 200 may be formed of an insulating material with a relatively low bendability. In detail, an epoxy resin may be used as the insulating material of the rigid insulating layer 200. In particular, a fiber reinforcing material such as glass fiber may be contained in the rigid insulating layer 200, and the rigid insulating layer 200 may be a prepreg. However, the material contained in the rigid insulating layer 200 is not limited to glass fiber. Additionally, inorganic fillers may be contained in the rigid insulating layer 200.

The rigid insulating layer 200 may be stacked on a portion of the flexible insulating layer 100. The rigid insulating layer 200 may be stacked on one surface of the portion of the flexible insulating layer 100 to implement an asymmetric PCB. A region where the rigid insulating layer 200 is stacked is the rigid region R. The rigid insulating layer 200 may not be included in the flexible region F and may only be included in the rigid region R. On the other hand, the flexible insulating layer 100 may be included in both the rigid region R and the flexible region F.

For example, the rigid region R of the PCB may be composed of the flexible insulating layer 100 and the rigid insulating layer 200, and the flexible region F may be composed of only the flexible insulating layer 100.

An antenna AN may be provided in the rigid insulating layer 200 of the rigid region R. The antenna AN may include various types of antennas such as a patch type, a dipole type, and the like. A plurality of patch antennas may be attached to the rigid insulating layer 200 to form an antenna array. Meanwhile, a ground layer may be formed around the antenna array of the rigid insulating layer 200.

A circuit electrically connected to the antenna AN may be formed on the rigid insulating layer 200 of the rigid region R. The circuit of the rigid insulating layer 200 may be connected to the connection circuit of the flexible insulating layer 100.

The rigid insulating layer 200 may be composed of a plurality of layers, and the antenna AN may be formed on the outermost layer of the rigid insulating layers 200. An auxiliary antenna may be formed on an inner layer of the rigid insulating layers 200, and the antenna AN formed on the outermost layer and the auxiliary antenna formed on the inner layer may face each other without physical connection, or may be directly connected through a via.

The electronic element 300 may be embedded in the flexible insulating layer 100 of the rigid region R to correspond to the rigid insulating layer 200. That is, the electronic element 300 may be embedded in the flexible insulating layer 100 of the rigid region R. In particular, the electronic element 300 may be embedded in at least one of the plurality of thermoplastic resin layers 120. The electronic element 300 may be embedded in a thick thermoplastic resin layer 120 among the plurality of thermoplastic resin layers 120. One surface of the electronic element 300 may be located at an interface between the thermosetting resin layer 110 and the thermoplastic resin layer 120. In this example, the electronic element 300 may be embedded in the thermoplastic resin layer 120 to be biased upward or downward from the center of the thermoplastic resin layer 120.

The electronic element 300 may include an active element, a passive element, etc., and specifically, may be an RFIC, a capacitor, or the like. In particular, the RFIC may be electrically connected to the antenna AN to process an RF signal.

In this example, a signal transmission distance may be shortened compared to an example where the electronic element 300 is located on an outermost layer of the rigid region R, and thus signal loss may be reduced.

The electronic element 300 may be connected to the circuit of the rigid insulating layer 200 through a via and may be connected to the connection circuit of the flexible insulating layer 100 through a via.

For example, as shown in FIG. 3A, the connection circuit may be formed on the surface F of the flexible insulating layer 100, the antenna AN may be electrically connected to the electronic element 300 through a circuit and a via VE, and the electronic element 300 may be connected to the connection circuit through a via VF. Here, the electronic element 300 may be embedded in the thermoplastic resin layer 120 to be biased toward the via VE, and thus the via VF may be longer than the via VE.

As shown in FIG. 3B, when the connection circuit is formed on the surface G of the flexible insulating layer 100, the antenna AN may be electrically connected to the electronic element 300 through a circuit and a via VE', and the electronic element 300 may be connected to the connection circuit through a via VF'. Here, the via VF of FIG. 3A may be omitted. Also, in this example, the coverlay may also be omitted.

However, a connection path between the electronic element 300 and the connection circuit may be implemented in various ways other than those described above, and the example is not limited thereto.

Fourth Example

Figure 4:
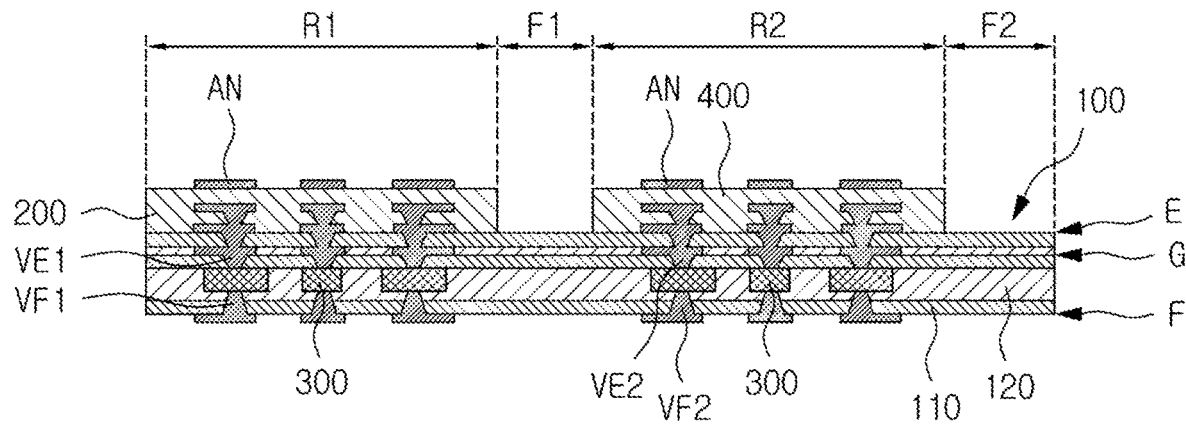
FIG. 4 is a diagram illustrating an example of a printed circuit board in accordance with one or more embodiments.

FIG. 4 is a diagram illustrating a PCB according to an example.

The PCB according to the example includes rigid regions R1 and R2 and flexible regions F1 and F2. The number of the rigid regions R is two and the number of the flexible regions F is also two. However, the number of rigid regions and the number of flexible regions is not limited to two.

Referring to FIG. 4, the PCB according to the example includes a flexible insulating layer 100, a first rigid insulating layer 200, a second rigid insulating layer 400, and an electronic element 300.

The flexible insulating layer 100 may include a plurality of thermosetting resin layers 110 and a plurality of thermoplastic resin layers 120, and may be formed by alternately stacking the plurality of thermosetting resin layers 110 and the plurality of thermoplastic resin layers 120. As shown in FIG. 4, three thermosetting resin layers 110 and two thermoplastic resin layers 120 may be alternately stacked such that the thermosetting resin layers 110 may be located on both outermost sides. Also, the plurality of thermosetting resin layers 110 may have different thicknesses. The plurality of thermoplastic resin layers 120 may have different thicknesses. The thermosetting resin layer 110 and the thermoplastic resin layer 120 may also have different thicknesses.

The flexible insulating layer 100 may be formed of a flexible and bendable insulating material. The insulating material of the thermosetting resin layers 110 may include at least one of PI, an LCP, PTFE, and PPS. Also, the insulating material of the thermoplastic resin layers 120 may have adhesiveness and may include at least one of modified polyimide, a modified epoxy resin, and PPE.

At least one of the thermosetting resin layer 110 and the thermoplastic resin layer 120 of the flexible insulating layer 100 may have a Df of 0.005 or less, preferably, 0.002 or less and a Dk of 3.5 or less, preferably, 3.0 or less.

A connection circuit may be formed on the flexible insulating layer 100. The connection circuit may be located on an outer surface E or F or an inner surface G of the flexible insulating layer 100 and may extend in the lengthwise direction of the flexible insulating layer 100 to electrically connect a first rigid region R1 to an external source (e.g., a main board, etc.) and electrically connect a second rigid region R2 to an external source. The connection circuit may be divided into a connection circuit for connecting the first rigid region R1 to an external source, and a connection circuit for connecting the second rigid region R2 to an external source, wherein the connection circuits may be insulated from each other.

When the connection circuit is formed on the outer surface of the flexible insulating layer 100, a flexible coverlay for protecting the connection circuit may be stacked on the outer side of the flexible insulating layer 100.

A connection pad P may be formed at one end of the flexible insulating layer 100. The connection circuit may be connected to the connection pad P.

The first rigid insulating layer 200 may be formed of an insulating material with a relatively low bendability. In detail, an epoxy resin may be used as the insulating material of the first rigid insulating layer 200. In particular, a fiber reinforcing material such as glass fiber may be contained in the first rigid insulating layer 200, and the first rigid insulating layer 200 may be a prepreg. However, the material contained in the rigid insulating layer 200 is not limited thereto. Meanwhile, inorganic fillers may be contained in the first rigid insulating layer 200.

The first rigid insulating layer 200 may be stacked on a portion of the flexible insulating layer 100. A region where the first rigid insulating layer 200 is stacked is the first rigid region R1.

The second rigid insulating layer 400 may be stacked on a second portion of the flexible insulating layer 100, and may be formed of the same material as the material of the first rigid insulating layer 200. A region where the second rigid insulating layer 400 is stacked is the second rigid region R2.

The first rigid insulating layer 200 may be stacked on one surface of a first portion of the flexible insulating layer 100, and the second rigid insulating layer 400 may be stacked on one surface of a second portion of the flexible insulating layer 100 to implement an asymmetric PCB.

The first rigid insulating layer 200 and the second rigid insulating layer 400 may be spaced apart from each other, and the first rigid region R1 and the second rigid region R2 may be spaced apart from each other.

A flexible region between the first rigid region R1 and the second rigid region R2 may be called a first flexible region F1, and a flexible region extending from the second rigid region R2 to the outside may be called a second flexible region F2.

The first flexible region F1 and the second flexible region F2 may be freely bent in different directions or at different angles depending on a mounting position of the PCB and a distance from the main board.

An antenna AN may be provided on at least one of the first rigid insulating layer 200 of the first rigid region R1, and the second rigid insulating layer 400 of the second rigid region R2. The antenna AN may include various types of antennas such as a patch type, a dipole type, and the like. A plurality of patch antennas may form an antenna array. A ground layer may be formed around the antenna array of the first rigid insulating layer 200 of the first rigid region R1 and the second rigid insulating layer 400 of the second rigid region R2.

A circuit electrically connected to the antenna AN may be formed on the first rigid insulating layer 200 of the first rigid region R1, and the second rigid insulating layer 400 of the second rigid region R2. The circuit of the first rigid insulating layer 200 of the first rigid region R1 and the second rigid insulating layer 400 of the second rigid region R2 may be connected to the connection circuit of the flexible insulating layer 100.

The first rigid insulating layer 200 may be composed of a plurality of layers, and the antenna AN may be formed on the outermost layer of the first rigid insulating layers 200. An auxiliary antenna may be formed in an inner layer of the rigid insulating layers 200, and the antenna AN formed in the outermost layer and the auxiliary antenna formed in the inner layer may face each other without physical connection or may be directly connected through a via.

The electronic element 300 may be embedded in the flexible insulating layer 100 to correspond to at least one of the first rigid insulating layer 200 and the second rigid insulating layer 400. The electronic element 300 may be embedded in the flexible insulating layer 100 located in at least one of the first rigid region R1 and the second rigid region R2. In particular, the electronic element 300 may be embedded in at least one of the plurality of thermoplastic resin layers 120. The electronic element 300 may be embedded in a thick thermoplastic resin layer 120 among the plurality of thermoplastic resin layers 120. One surface of the electronic element 300 may be located at an interface between the thermosetting resin layer 110 and the thermoplastic resin layer 120. In this example, the electronic element 300 may be embedded in the thermoplastic resin layer 120 to be biased upward or downward from the center of the thermoplastic resin layer 120.

The electronic element 300 may include an active element, a passive element, etc., and specifically, may be an RFIC, a capacitor, or the like. In particular, the RFIC may be electrically connected to the antenna AN to process an RF signal.

In this example, a signal transmission distance may be shortened compared to an example where the electronic element 300 is located on an outermost layer of the rigid region R1 or R2, and thus signal loss may be reduced.

In the first rigid region R1, the electronic element 300 may be connected to the circuit of the rigid insulating layer 200 through a via and may be connected to the connection circuit of the flexible insulating layer 100 through a via. Also, in the second rigid region R2, the electronic element 300 may be connected to the circuit of the second rigid insulating layer 400 through a via and may be connected to the connection circuit of the flexible insulating layer 100 through a via.

For example, the connection circuit may be formed on the surface F of the flexible insulating layer 100, the antenna AN of the first rigid region R1 may be electrically connected to the electronic element 300 of the first rigid region R1 through a circuit and a via VE1, and the electronic element 300 of the first rigid region R1 may be connected to the connection circuit through a via VF1. Also, the antenna AN of the second rigid region R2 may be electrically connected to the electronic element 300 of the second rigid region R2 through a circuit and a via VE2, and the electronic element 300 of the second rigid region R2 may be connected to the connection circuit through a via VF2.

Meanwhile, the connection circuit may be formed on both of the surface F and the surface G of the flexible insulating layer 100. The connection circuit formed on the surface F may be connected to the electronic element 300 embedded in the first rigid region R1, and the connection circuit formed on the surface G may be connected to the electronic element 300 embedded in the second rigid region R2.

As described above, the two rigid regions R1 and R2 may be connected to the same flexible insulating layer 100, and the connection circuit may be implemented in various ways. However, the examples are not limited thereto.

Fifth Example

Figure 5:
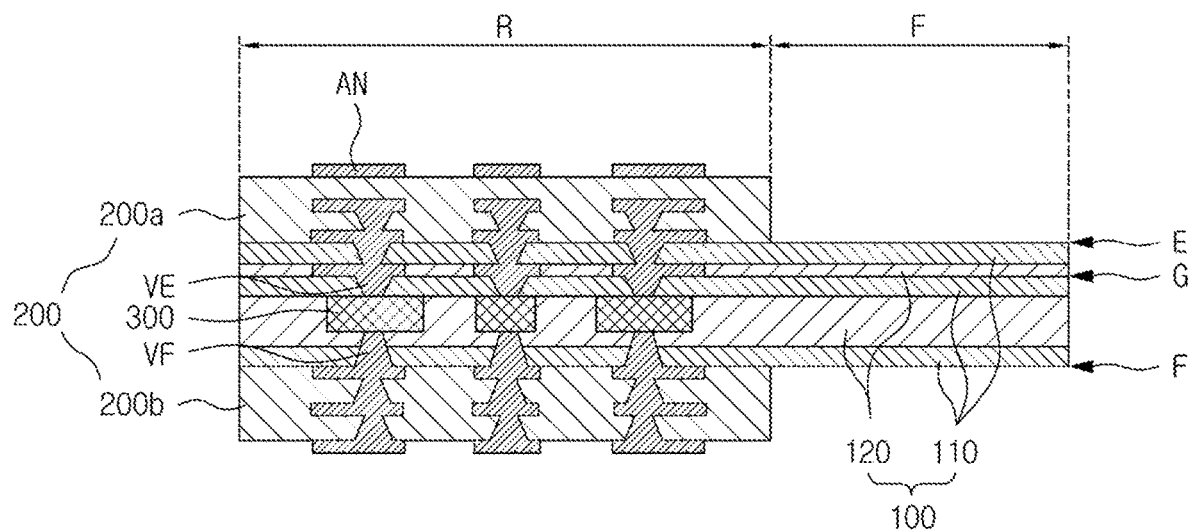
FIG. 5 is a diagram illustrating an example of a printed circuit board in accordance with one or more embodiments.

FIG. 5 is a diagram illustrating a PCB according to an example.

The PCB according to the example may have a rigid region R and a flexible region F.

The PCB according to the example may include a flexible insulating layer 100, rigid insulating layers 200a and 200b, and an electronic element 300.

The flexible insulating layer 100 may include a plurality of thermosetting resin layers 110 and a plurality of thermoplastic resin layers 120, and may be formed by alternately stacking the plurality of thermosetting resin layers 110 and the plurality of thermoplastic resin layers 120.

The rigid insulating layer 200 may be composed of two layers, 200a, and 200b, and the two rigid insulating layers 200a and 200b may be respectively stacked on both surfaces of a portion of the flexible insulating layer 100. The two rigid insulating layers 200 may have the same width and may together constitute one rigid region R.

An antenna AN may be formed on one of the two rigid insulating layers 200a and 200b stacked on both surfaces of the flexible insulating layer 100, and the other of the two rigid insulating layers 200a and 200b may include a circuit and a ground.

The fifth example is similar to the third example (see FIG. 3A), except that the rigid insulating layers 200 are stacked on both surfaces of a portion of the flexible insulating layer 100. In the fifth example, the elements that have been described in the aforementioned examples will no longer be described.

Sixth Example

Figure 6:
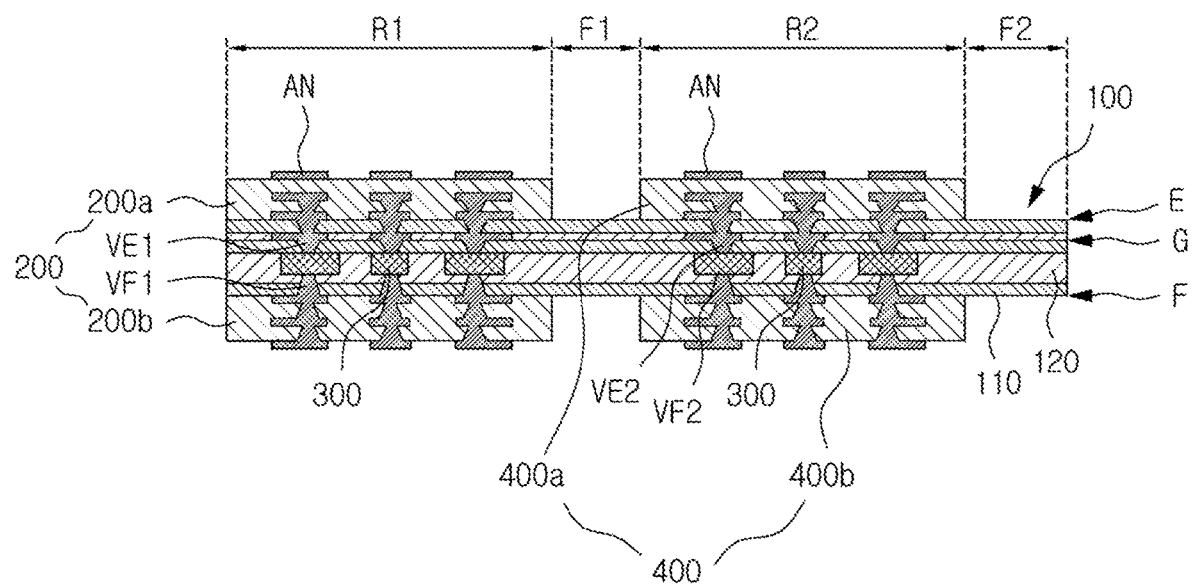
FIG. 6 is a diagram illustrating an example of a printed circuit board in accordance with one or more embodiments.

FIG. 6 is a diagram illustrating a PCB according to an example.

The PCB according to the example may include rigid regions R and flexible regions F. The number of the rigid regions R1 and R2 is two and the number of the flexible regions F1 and F2 is also two. However, the number of rigid regions and the number of flexible regions is not limited thereto.

The PCB according to the example may include a flexible insulating layer 100, a first rigid insulating layer 200, a second rigid insulating layer 400, and an electronic element 300.

The flexible insulating layer 100 may include a plurality of thermosetting resin layers 110 and a plurality of thermoplastic resin layers 120 and may be formed by alternately stacking the plurality of thermosetting resin layers 110 and the plurality of thermoplastic resin layers 120.

The first rigid insulating layer 200 may be composed of two layers, 200a and 200b, and the second rigid insulating layer 400 may be composed of two layers, 400a and 400b. However, this is only an example, and the first rigid insulating layer 200 and the second rigid insulating layer 400 may be composed of more than two layers. The two first rigid insulating layers 200a and 200b may be respectively stacked on both surfaces of a first portion of the flexible insulating layer 100, and the two second rigid insulating layers 400a and 400b may be respectively stacked on both surfaces of a second portion of the flexible insulating layer 100. The first portion and the second portion of the flexible insulating layer 100 may be spaced apart from each other, and the first rigid insulating layer 200 and the second rigid insulating layer 400 may be spaced apart from each other.

The two first rigid insulating layers 200a and 200b may have the same width and may together constitute the first rigid region R1. Also, the two second rigid insulating layers 400a and 400b may have the same width and may together constitute the second rigid region R2. The first rigid region R1 and the second rigid region R2 may be spaced apart from each other.

An antenna AN may be formed on the first rigid insulating layer 200a and the second rigid insulating layer 400a provided on one surface of the flexible insulating layer 100, and a circuit, a ground, and the like may be formed on the first rigid insulating layer 200b and the second rigid insulating layer 400b provided on the other surface of the flexible insulating layer 100.

The sixth example is similar to the fourth example (see FIG. 4), except that the rigid insulating layers 200 are stacked on both surfaces of a portion of the flexible insulating layer 100 and the second rigid insulating layers 400 are stacked on both surfaces of another portion of the flexible insulating layer 100. In the sixth example, the elements that have been described in the aforementioned examples will no longer be described.

Seventh Example

Figure 7:
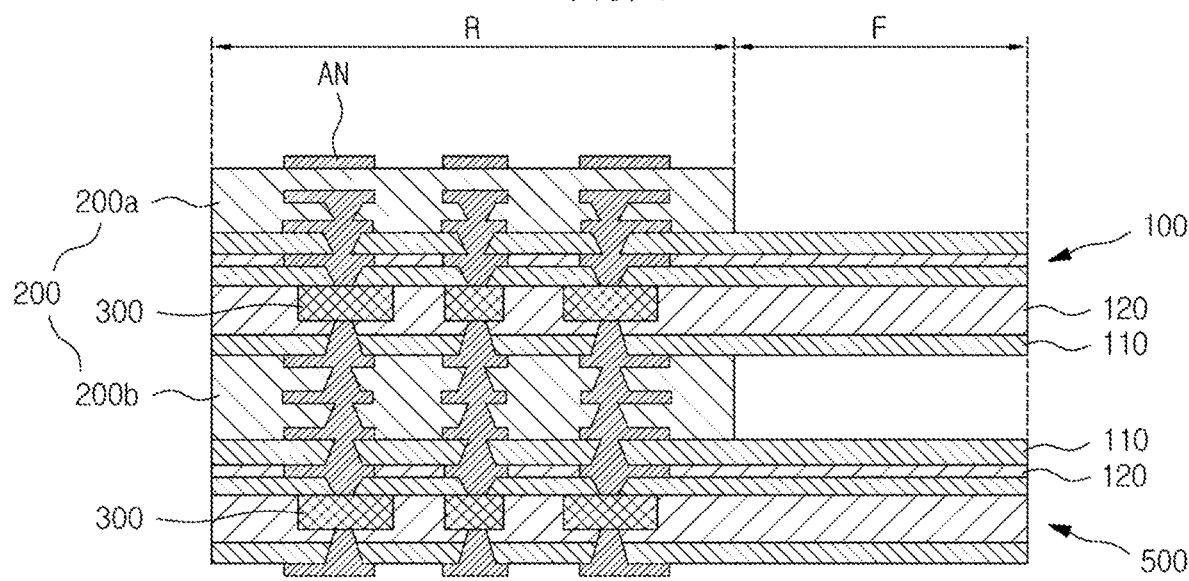
FIG. 7 is a diagram illustrating an example of a printed circuit board in accordance with one or more embodiments.

FIG. 7 is a diagram illustrating a PCB according to an example.

The PCB according to the example may have a rigid region R and a flexible region F.

The PCB according to the example may include a first flexible insulating layer 100, a rigid insulating layer 200, a second flexible insulating layer 500, and an electronic element 300.

The first flexible insulating layer 100 may include a plurality of thermosetting resin layers 110 and a plurality of thermoplastic resin layers 120, and may be formed by alternately stacking the plurality of thermosetting resin layers 110 and the plurality of thermoplastic resin layers 120.

The rigid insulating layer 200 may be stacked on both surfaces of a portion of the first flexible insulating layer 100. That is, the rigid insulating layer 200 may be composed of two layers 200a and 200b, and the two rigid insulating layers 200a and 200b may be respectively stacked on both surfaces of a portion of the first flexible insulating layer 100. An antenna AN may be formed on a first surface of the two rigid insulating layers 200, and a second surface of the two rigid insulating layers 200 may have a circuit and a ground.

The second flexible insulating layer 500 may be stacked on one of the two rigid insulating layers 200. One of the two rigid insulating layers, 200b, may be interposed between the first flexible insulating layer 100 and the second flexible insulating layer 500. The second of the two rigid insulating layers 200a may be located at the outer side of the PCB and may include the antenna AN.

The second flexible insulating layer 500 may have the same layer configuration as the first flexible insulating layer 100. The first flexible insulating layer 100 and the second flexible insulating layer 500 may have an independent connection pad at each end. When the PCB is mounted on a main board, the first flexible insulating layer 100 and the second flexible insulating layer 500 may be bent in different directions and then connected to the main board.

In the seventh example, the two rigid insulating layers 200a and 200b, the first flexible insulating layer 100, and the second flexible insulating layer 500 constitute the rigid region R, and the flexible insulating layer 100 and the second flexible insulating layer 500 constitute the flexible region F.

The electronic element 300 may be embedded in at least one of the first flexible insulating layer 100 and the second flexible insulating layer 500. Also, both of the first flexible insulating layer 100 and the second flexible insulating layer 500 may have a connection circuit. The connection circuit may be electrically connected to the electronic element 300 through various paths.

It can be understood that the seventh example may simply be the second flexible insulating layer 500 added to the fifth example (see FIG. 5). In the seventh example, the elements that have been described in the aforementioned examples will no longer be described.

Eighth Example

Figure 8:
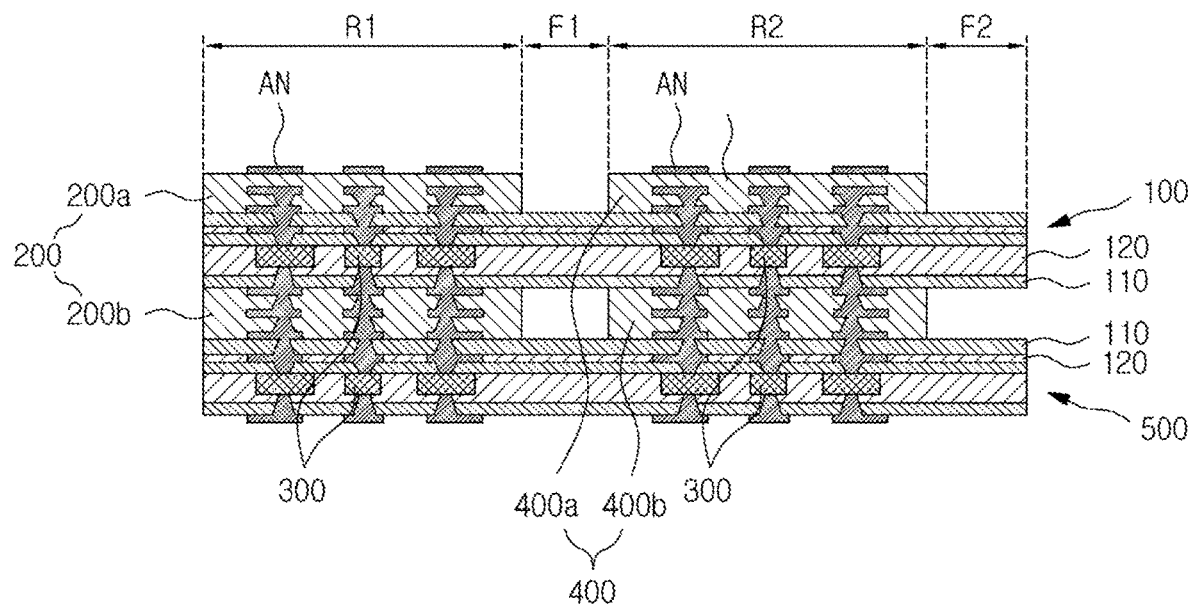
FIG. 8 is a diagram illustrating an example of a printed circuit board in accordance with one or more embodiments.

FIG. 8 is a diagram illustrating a PCB according to an example.

The PCB according to the example includes rigid regions R and flexible regions F. The number of the rigid regions R1 and R2 is two and the number of the flexible regions F1 and F2 is also two. However, the number of rigid regions and flexible regions is not limited thereto.

The PCB according to the eighth example includes a first flexible insulating layer 100, a first rigid insulating layer 200, a second rigid insulating layer 400, a second flexible insulating layer 500, and an electronic element 300.

The first flexible insulating layer 100 may include a plurality of thermosetting resin layers 110 and a plurality of thermoplastic resin layers 120, and may be formed by alternately stacking the plurality of thermosetting resin layers 110 and the plurality of thermoplastic resin layers 120.

The second flexible insulating layer 500 may have the same layer configuration as the first flexible insulating layer 100. The first flexible insulating layer 100 and the second flexible insulating layer 500 may have an independent connection pad at each end. When the PCB is mounted on a main board, the first flexible insulating layer 100 and the second flexible insulating layer 500 may be bent in different directions and then connected to the main board.

The two first rigid insulating layers 200a and 200b may be respectively stacked on both surfaces of a first portion of the first flexible insulating layer 100, and the two second rigid insulating layers 400a and 400b may be respectively stacked on both surfaces of a second portion of the first flexible insulating layer 100. The second flexible insulating layer 500 may be stacked on one of the first rigid insulating layers 200b and one of the second rigid insulating layers 400b.

One of the two first rigid insulating layers 200 may be interposed between the first flexible insulating layer 100 and the second flexible insulating layer 500. One of the two second rigid insulating layers 400 may be interposed between the first flexible insulating layer 100 and the second flexible insulating layer 500.

Here, the first rigid region R1 includes the first flexible insulating layer 100, the second flexible insulating layer 500, and the two first rigid insulating layers 200a and 200b formed on both surfaces of a first portion of the flexible insulating layer 100. Additionally, the second rigid region R2 includes the first flexible insulating layer 100, the second flexible insulating layer 500, and the two second rigid insulating layers 400a and 400b formed on both surfaces of a second portion of the flexible insulating layer 100. Here, the first rigid region R1 and the second rigid region R2 are spaced apart from each other.

The electronic element 300 may be embedded in at least one of the first flexible insulating layer 100 or the second flexible insulating layer 500 included in the first rigid region R1, and the first flexible insulating layer 100 or the second flexible insulating layer 500 included in the second rigid region R2.

Additionally, both of the first flexible insulating layer 100 and the second flexible insulating layer 500 may have a connection circuit. The connection circuit may be electrically connected to the electronic element 300 through various paths.

It can be understood that the eighth example is simply the second flexible insulating layer 500 added to the sixth example (see FIG. 6). The second flexible insulating layer 500 may be the same as that described in the seventh example. In the eight example, the elements that have been described in the aforementioned examples will no longer be described.

Ninth Example

Figure 9:
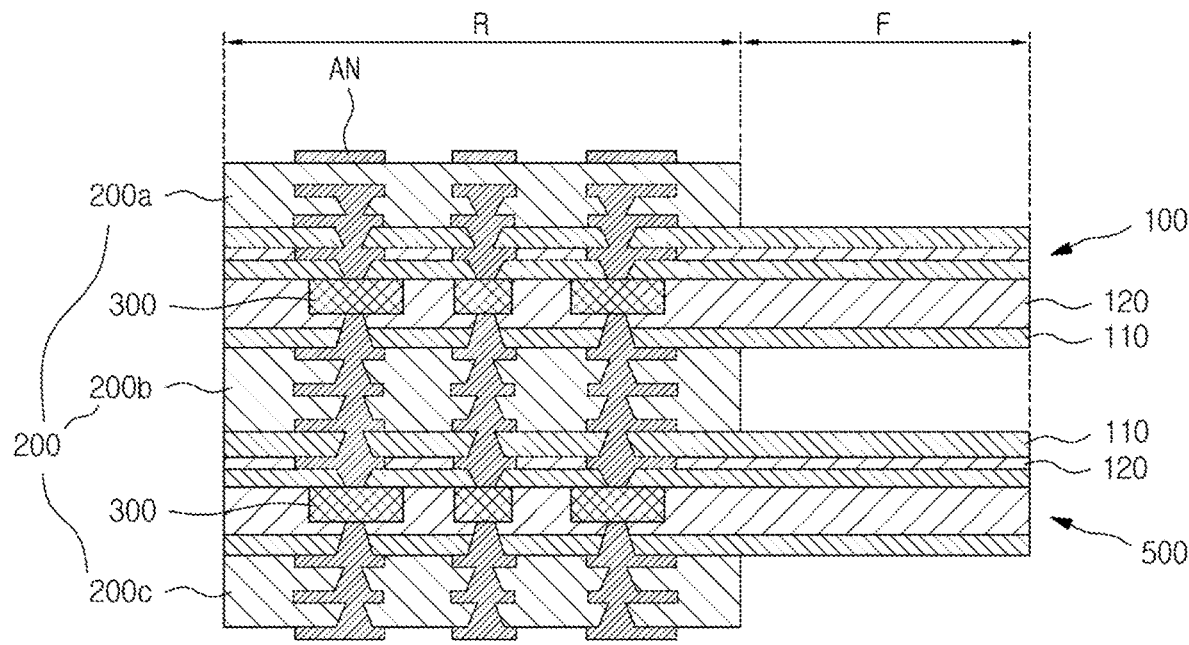
FIG. 9 is a diagram illustrating an example of a printed circuit board in accordance with one or more embodiments.

FIG. 9 is a diagram illustrating a PCB according to a ninth example.

The PCB according to the ninth example has a rigid region R and a flexible region F.

The PCB according to the ninth example includes a first flexible insulating layer 100, a rigid insulating layer 200, a second flexible insulating layer 500, and at least one electronic element 300. The rigid insulating layer 200 may be composed of three layers, 200a, 200b, and 200c, and the PCB according to the ninth example may have a symmetric structure with respect to the rigid insulating layer 200 at the center.

The first flexible insulating layer 100 may include a plurality of thermosetting resin layers 110 and a plurality of thermoplastic resin layers 120, and may be formed by alternately stacking the plurality of thermosetting resin layers 110 and the plurality of thermoplastic resin layers 120.

The second flexible insulating layer 500 may have the same configuration as the first flexible insulating layer 100. The first flexible insulating layer 100 and the second flexible insulating layer 500 may have an independent connection pad at each end. When the PCB is mounted on a main board, the first flexible insulating layer 100 and the second flexible insulating layer 500 may be bent in different directions and then connected to the main board.

The rigid insulating layer 200 may be composed of three layers, 200a, 200b, and 200c. Two of the three layers may be stacked on the outer side of the first flexible insulating layer 100 and the outer side of the second flexible insulating layer 500, and the third of the three layers may be interposed between the first flexible insulating layer 100 and the second flexible insulating layer 500. It is to be noted that the number of layers of the rigid insulating layer 200 is not limited to three.

Here, the rigid region R includes the three rigid insulating layers 200a, 200b, and 200c, the first flexible insulating layer 100, and the second flexible insulating layer 500, and the flexible region F includes the first flexible insulating layer 100 and the second flexible insulating layer 500.

The electronic element 300 may be embedded in at least one of the first flexible insulating layer 100 and the second flexible insulating layer 500 included in the rigid region R. Additionally, both of the first flexible insulating layer 100 and the second flexible insulating layer 500 may have a connection circuit. The connection circuit may be electrically connected to the electronic element 300 through various paths.

It can be understood that the ninth example is simply a third rigid insulating layer added to the seventh example (see FIG. 7). In the ninth example, the elements that have been described in the aforementioned examples will no longer be described.

Tenth Example

Figure 10:
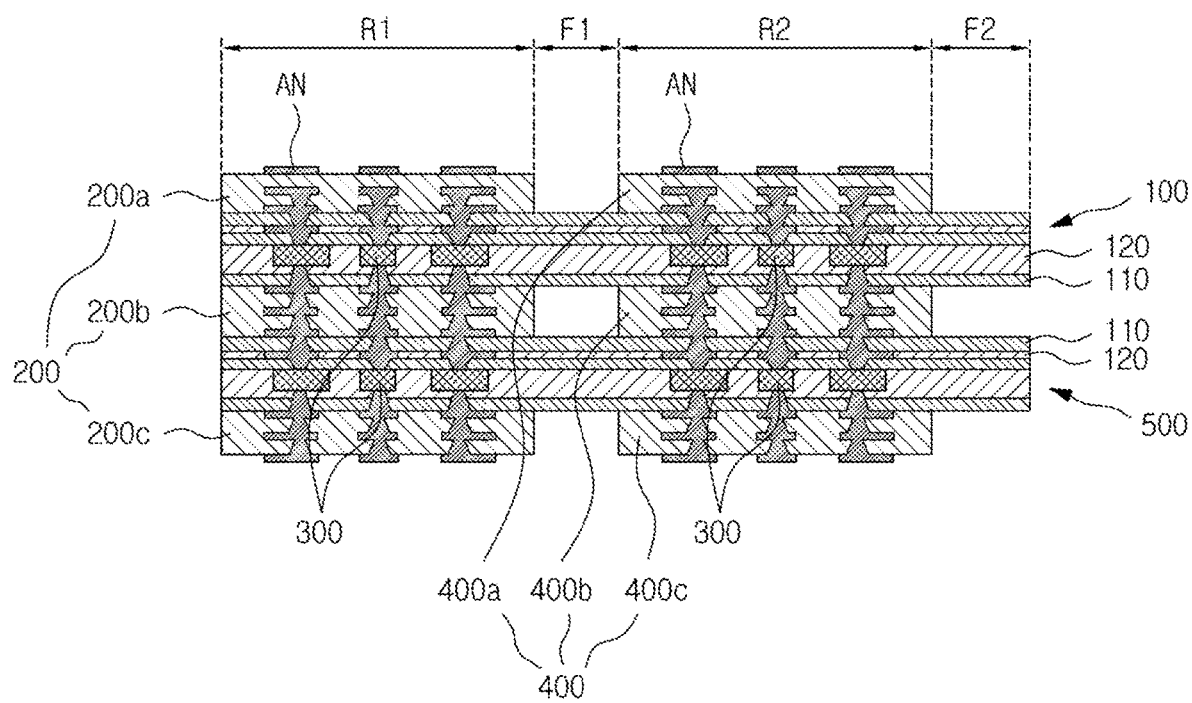
FIG. 10 is a diagram illustrating an example of a printed circuit board in accordance with one or more embodiments.

FIG. 10 is a diagram illustrating a PCB according to a tenth example.

The PCB according to the tenth example includes rigid regions R1 and R2 and flexible regions F1 and F2. The number of the rigid regions R1 and R2 is two and the number of the flexible regions F1 and F2 is two. However, this is only an example, and the number of rigid regions and flexible regions is not limited thereto.

The PCB according to the tenth example includes a first flexible insulating layer 100, a rigid insulating layer 200, a second rigid insulating layer 400, a second flexible insulating layer 500, and an electronic element 300.

The first flexible insulating layer 100 may include a plurality of thermosetting resin layers 110 and a plurality of thermoplastic resin layers 120 and may be formed by alternately stacking the plurality of thermosetting resin layers 110 and the plurality of thermoplastic resin layers 120.

The second flexible insulating layer 500 may have the same configuration as the first flexible insulating layer 100. The first flexible insulating layer 100 and the second flexible insulating layer 500 may have an independent connection pad at each end. When the PCB is mounted on a main board, the first flexible insulating layer 100 and the second flexible insulating layer 500 may be bent in different directions and then connected to the main board.

The rigid insulating layer 200 may be composed of three layers, 200a, 200b, and 200c. Two of the three layers (200a and 200c) may be stacked on the outer side of the first flexible insulating layer 100 and the outer side of the second flexible insulating layer 500, and the third of the three layers (200b) may be interposed between the first flexible insulating layer 100 and the second flexible insulating layer 500.

The second rigid insulating layer 400 may be composed of three layers, 400a, 400b, and 400c. Two of the three layers (400a and 400c) may be stacked on the outer side of the first flexible insulating layer 100 and the outer side of the second flexible insulating layer 500, and the third of the three layers (400b) may be interposed between the first flexible insulating layer 100 and the second flexible insulating layer 500.

In the first flexible insulating layer 100 and the second flexible insulating layer 500, the region of the rigid insulating layer 200 is spaced apart from the region of the second rigid insulating layer 400.

The first rigid region R1 includes the three rigid insulating layers 200a, 200b, and 200c, the first flexible insulating layer 100, and the second flexible insulating layer 500, and the second rigid region R2 includes the three second rigid insulating layers 400a, 400b, and 400c, the first flexible insulating layer 100, and the second flexible insulating layer 500. The first rigid region R1 and the second rigid region R2 may be spaced apart from each other.

The first flexible region F1 includes the first flexible insulating layer 100 and the second flexible insulating layer 500, and the second flexible region F2 includes the first flexible insulating layer 100 and the second flexible insulating layer 500.

The electronic element 300 may be embedded in at least one of the first flexible insulating layer 100 or the second flexible insulating layer 500 included in the first rigid region R1, and the first flexible insulating layer 100 or the second flexible insulating layer 500 included in the second rigid region R2.

Additionally, both of the first flexible insulating layer 100 and the second flexible insulating layer 500 may have a connection circuit. The connection circuit may be electrically connected to the electronic element 300 through various paths.

It can be understood that the tenth example is simply one more rigid insulating layer and one more second rigid insulating layer added to the eighth example (see FIG. 8). In the tenth example, the elements that have been described in the aforementioned examples will no longer be described.

PCB Manufacturing Method

FIGS. 11A to 11H illustrate a method of manufacturing the printed circuit board of the various examples. In particular, FIGS. 11A to 11H illustrate a method of manufacturing the printed circuit board of the fifth example.

Figure 11A:
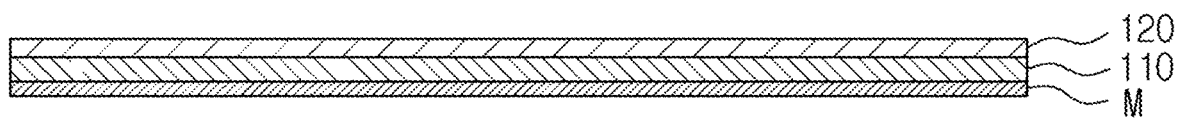
FIGS. 11A-11H are diagrams illustrating an example of a method of manufacturing a printed circuit board in accordance with one or more embodiments.

Referring to FIG. 11A, a raw material (single-sided flexible copper clad laminate (FCCL)) in which a metal layer M, a thermosetting resin layer 110, and a thermoplastic resin layer 120 are stacked together is prepared.

Figure 11B:
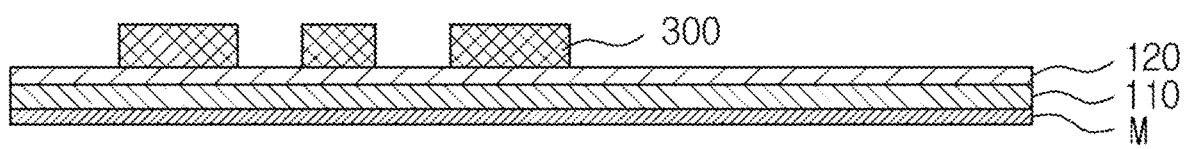

Referring to FIG. 11B, an electronic element 300 is attached to the thermoplastic resin layer 120.

Figure 11C:
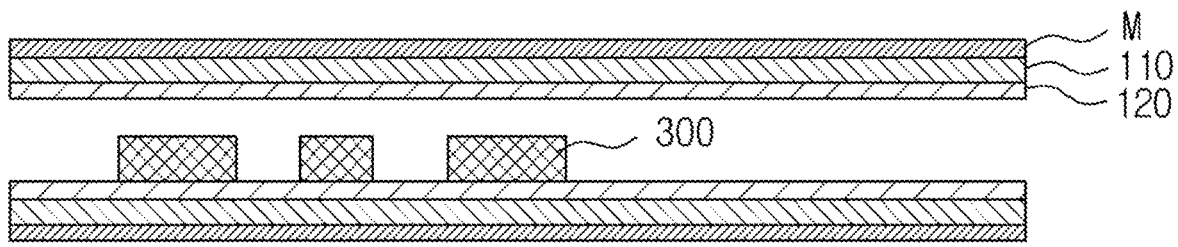
Figure 11D:
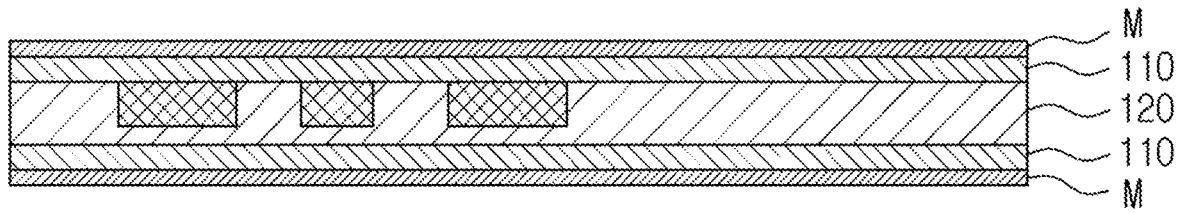

Referring to FIGS. 11C and 11D, another single-sided FCCL is disposed on, and then attached to, the electronic element 300 to bond the thermoplastic resin layers 120 to one another. Since the thermoplastic resin layer 120 has adhesiveness, the electronic element 300 may be effectively embedded in the thermoplastic resin layer 120.

Figure 11E:
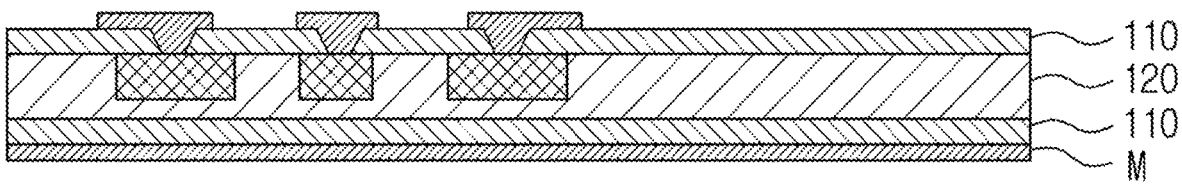

Referring to FIG. 11E, a circuit, a via, and a connection circuit (not shown) of a rigid region R may be formed as needed.

Figure 11F:
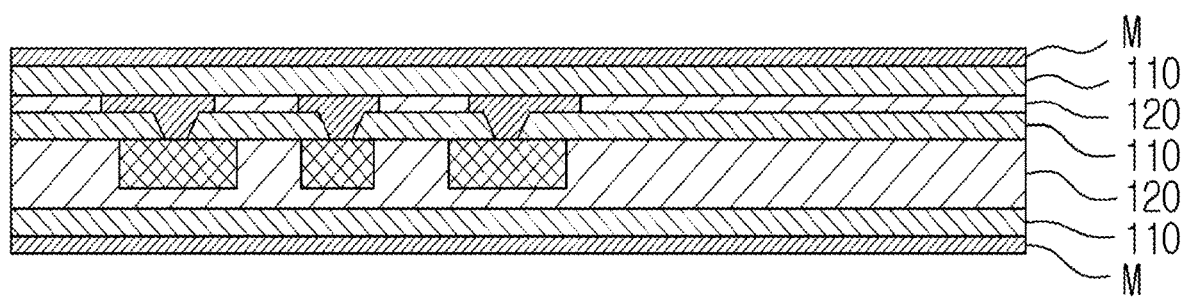

Referring to FIG. 11F, still another single-sided FCCL is attached to complete a layer configuration of a flexible insulating layer 100.

Figure 11G:
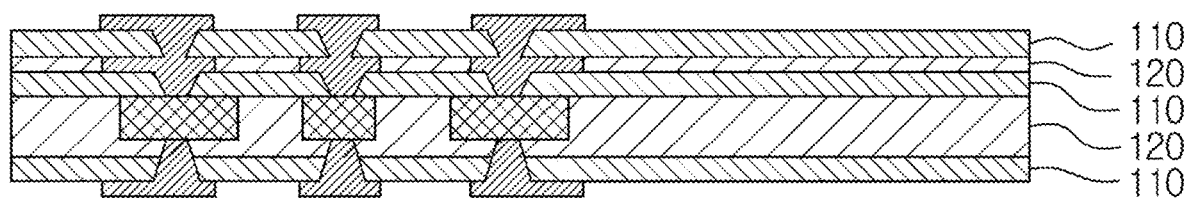

Referring to FIG. 11G, a circuit, a via, and a connection circuit (not shown) of the rigid region R are further formed as needed.

Figure 11H:
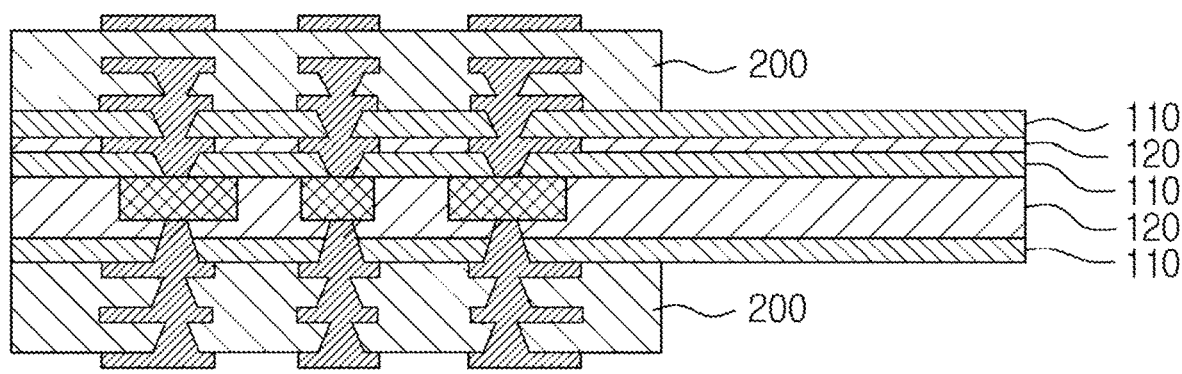

Referring to FIG. 11H, a rigid insulating layer 200 is stacked on both surfaces of the flexible insulating layer 100. The rigid insulating layer 200 is stacked on both surfaces of a portion of the flexible insulating layer 100. Meanwhile, an antenna AN is formed on the rigid insulating layer 200.

Electronic Device

Figure 12:
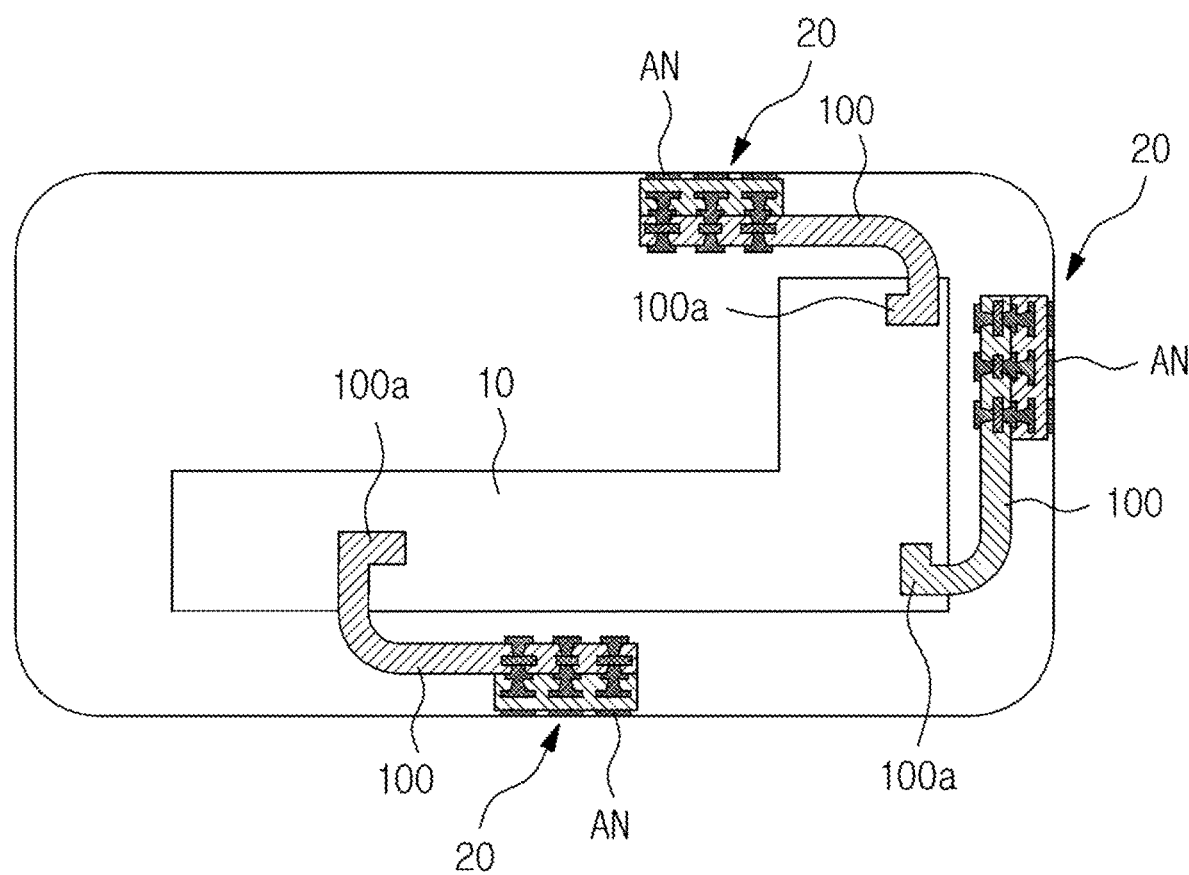
FIG. 12 is a diagram illustrating an example of an electronic device including a printed circuit board in accordance with one or more embodiments.

FIG. 12 is a diagram showing an electronic device according to an example.

Referring to FIG. 12, the electronic device according to an example includes a main board 10 to which a PCB 20 is coupled, and the PCB 20 includes a flexible insulating layer 100 having an end connected to the main board 10; a rigid insulating layer 200 stacked on a portion of the flexible insulating layer 100; and an electronic element 300 embedded in the flexible insulating layer 100 to correspond to the rigid insulating layer 200.

As the PCB 20 according to this example, the PCBs according to the first to tenth examples, which have been described with reference to FIGS. 1 to 10, may all be utilized.

The PCB 20 may be coupled to a housing of the electronic device such that an antenna is directed to the outside.

The flexible insulating layer 100 of the PCB 20 may be coupled to the main board 10, a bent portion 100a formed at one end of the flexible insulating layer 100 may be bent, and a connection pad of the bent portion 100a may be coupled to a terminal of the main board 10 through soldering.

A plurality of PCBs 20 may be coupled to a single main board 10. When a plurality of antennas (an antenna array) are required in an electronic device, the plurality of PCBs 20 may be formed to correspond to a required number of antennas, and the flexible insulating layer 100 may be bent in various directions. Thus, the antennas may be disposed in various locations.

When the PCB 20 includes a second flexible insulating layer 500, the flexible insulating layer 100 and the second flexible insulating layer 500 may each have a connection pad and may be bent in different directions and coupled to the main board, but the present invention is not limited thereto.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board, comprising:
a first flexible insulating layer;
a first rigid insulating layer stacked on a first portion of the first flexible insulating layer; and
an electronic element embedded in the first flexible insulating layer in stacked formation with the rigid insulating layer,
wherein the first flexible insulating layer comprises a thermoplastic resin layer and a thermosetting resin layer, and
wherein the electronic element is embedded in the thermoplastic resin layer.

2. The printed circuit board of claim 1, further comprising an antenna that is formed on the first rigid insulating layer.

3. The printed circuit board of claim 1, wherein the thermosetting resin layer is stacked on at least one surface of the thermoplastic resin layer.

4. The printed circuit board of claim 1, wherein the thermoplastic resin layer and the thermosetting resin layer are each formed in a plurality of layers,
the first flexible insulating layer is formed by alternately stacking the plurality of thermoplastic resin layers and the plurality of thermosetting resin layers, and
the electronic element is embedded in at least one of the plurality of thermoplastic resin layers.

5. The printed circuit board of claim 1, wherein the first rigid insulating layer is stacked on at least one surface of the first portion of the first flexible insulating layer.

6. The printed circuit board of claim 1, further comprising a second flexible insulating layer stacked on the first rigid insulating layer,
wherein the electronic element is embedded in at least one of the first flexible insulating layer and the second flexible insulating layer.

7. The printed circuit board of claim 1, further comprising a second rigid insulating layer stacked on a second portion of the first flexible insulating layer,
wherein the first rigid insulating layer and the second rigid insulating layer are spaced apart from each other.

8. The printed circuit board of claim 7, wherein the electronic element is configured to be mounted in stacked formation with at least one of the first rigid insulating layer and the second rigid insulating layer.

9. The printed circuit board of claim 7, wherein the second rigid insulating layer is stacked on at least one surface of the second portion of the first flexible insulating layer.

10. The printed circuit board of claim 1, further comprising a connection pad formed at an end of the first flexible insulating layer.

* * * * *